United States Patent [19]

Pierro, Jr.

[11] 4,437,056

[45] Mar. 13, 1984

[54] CAB SIGNAL TEST SET FOR AUTOMATICALLY TESTING THE PICKUP COILS AND CHECKING AN AMPLIFIER OF CAB SIGNAL EQUIPMENT

[75] Inventor: Joseph J. Pierro, Jr., Dayton, Pa.

[73] Assignee: American Standard Inc., Swissvale, Pa.

[21] Appl. No.: 249,581

[22] Filed: Mar. 31, 1981

[51] Int. Cl.³ .................... G01R 15/12; G08B 29/00
[52] U.S. Cl. .................... 324/73 AT; 340/514; 371/15
[58] Field of Search ............ 324/73 AT, 73 R, 202; 246/182 R; 340/514, 515, 516; 371/15, 25

[56] References Cited

U.S. PATENT DOCUMENTS

| 2,595,518 | 5/1952 | Gassett | 324/73 R |
| 4,055,801 | 10/1977 | Pike et al. | 324/73 AT |
| 4,109,199 | 8/1978 | Ball et al. | 324/202 |

Primary Examiner—Gerard R. Strecker
Assistant Examiner—Walter E. Snow
Attorney, Agent, or Firm—J. B. Sotak

[57] ABSTRACT

An automatic electronic cab signal test set for testing the integrity of a pair of pickup coils and for checking the sensitivity of the amplifier of the cab signal receiver. A mode selector is connected to a clock oscillator which produces clock pulses. The clock pulses are connected to an up/down binary counter which sequentially counts up from zero to a maximum count and then sequentially counts down from the maximum count to zero. The up/down binary counter is connected to a code selector which changes the time constant of an R-C network of a code oscillator. The code oscillator illuminates an idication when the cab signal receiver is under test and modulates the carrier signal of a carrier oscillator. The modulated carrier signal is fed to the input of a constant current source which has its output directly connected to the pickup coils and the amplifier of the cab signal receiver. A low-high switch conditions and powers the test set which goes through a simulated low rail current speed command sequence and then goes through a simulated high rail current speed command sequence.

13 Claims, 2 Drawing Figures

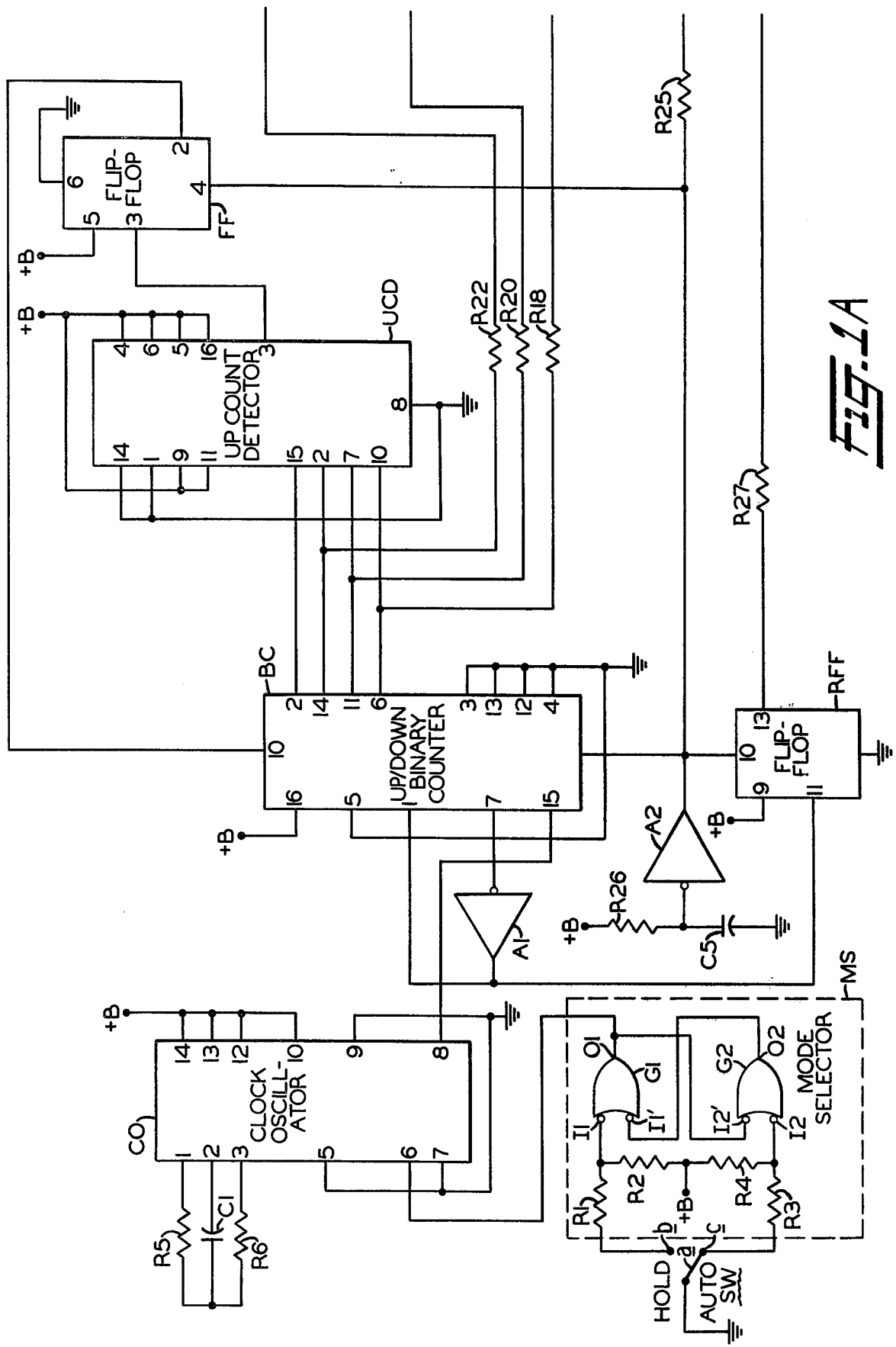

4,437,056

CAB SIGNAL TEST SET FOR AUTOMATICALLY TESTING THE PICKUP COILS AND CHECKING AN AMPLIFIER OF CAB SIGNAL EQUIPMENT

FIELD OF THE INVENTION

This invention relates to an electronic test set for testing the cab signal equipment and more particularly to an automatic departure testing unit for checking the sequential reception of the simulated coded speed command signals which are directly injected into the pickup coils and amplifier of the cab signal receiver and for verifying the integrity of the pickup coils and the sensitivity of the amplifier of the cab signal receiver.

BACKGROUND OF THE INVENTION

In automatic train protection equipment for railway and mass and/or rapid transit operations, it is mandatory to perform a daily departure test on each locomotive or lead vehicle before releasing a train into regular revenue service. Normally, the departure test was conducted on a special section of track which was equipped with a loop of wire. The wire loop was connected to associated circuitry which was initiated from the wayside to inductively couple feigned cab signals into pickup coils mounted forward of the front axle of the lead vehicle or locomotive. An alternative method that was previously employed to perform the required departure test utilized a pair of external coils which were meticulously positioned beneath the pickup coils of the vehicle. In practice, the two inductive coils were manually disposed a predetermined distance from car carried pickup coils so that the simulated cab signals produced by the associated external electronic equipment could be sufficiently magnetically coupled to the pickup coils. It will be appreciated that both of the previous departure testing methods not only were time consuming but also were expensive from the standpoint of required equipment. Further, the railway vehicle under test was unduly delayed because of the excessive amount of time necessary for setting up and conducting the daily departure test. In addition, it is generally an authoritative requirement to conduct a monthly inspection of the vehicle in order to ensure that the cab signal equipment is operating in a satisfactory manner. Ideally, it would be desirable to have a single individual conduct the test rather than having a man on board observing the instruments and having another man installing and adjusting the pickup coil outside the vehicle. Further, it would be highly advantageous to conduct the test cab signal equipment at any convenient location rather than being restricted to the place where the wayside coils are located or where the track loop is situated.

OBJECTS OF THE INVENTION

Accordingly, it is an object of this invention to provide a new and improved electronic testing unit.

Another object of the invention is to provide a unique daily departure and/or monthly inspection test set which automatically tests the various speed command signal functions of a vehicle.

A further object of this invention is to provide an automatic departure testing unit which may be used to perform the daily departure tests or monthly inspection and verification on cab signal equipment.

Yet another object of this invention is to provide an automatic electronic testing unit which checks the proper operation of the cab signal equipment by directly injecting simulated speed command signals into the pickup coils and receiver.

Yet a further object of this invention is to provide a built-in and/or portable testing unit which automatically tests for cab signal speed command reception by direct signal injection into the pickup coils and receiver.

Still another object of this invention is to provide a cab signal test set for automatically testing the integrity of the pickup coils and operation of the receiver of the cab signal equipment from on board the vehicle.

Still a further object of this invention is to provide a cab signal test set for automatically testing the integrity of the pickup coils and the operation of the receiver comprising, mode selector means connected to a clock means, said clock means connected to a counting means, said counting means connected to a code selecting means, said code selecting means connected to a code oscillating means, said code oscillating means connected to a carrier oscillating means, said carrier oscillating means directly injecting in a sequential order a selected one of a series of modulated carrier signals into the pickup coils and receiver to simulate legitimate cab signal speed commands for verifying the functionality of the cab signal equipment.

An additional object of this invention is to provide an automatic electronic cab signal test set which is economical in cost, unique in design, efficient in operation, dependable in service, durable in use, and easy to construct.

SUMMARY OF THE INVENTION

In the attainment of the above objects, there is provided a solid-state or electronic cab signal test set for automatically checking the integrity of a pair of inductive pickup coils and for evaluating the sensitivity of the amplifier of a cab signal receiver. The test set includes a mode selector having a pair of "OR" gates which produce a low output when a single-pole double-throw switch is in an automatic position and which produces a high output when the single-pole double-throw switch is in a Hold position. A clock oscillator is activated by the low output of the mode selector to generate a series of clock pulses. The clock pulses are fed to an up/down binary counter which is sequentially stepped upwardly from a binary zero to a maximum count and then sequentially stepped downwardly from the maximum to the binary zero. A code selector is responsive to the count of the up/down binary count for switching a selected one of a plurality of resistors in the R-C timing network of a code oscillator for generating a selected one of a plurality of code signals. An indicating circuit including a switching transistor for flashing a light emitting diode in accordance with the selected coded rate and for constantly illuminating the light emitting diode when the binary counter is in a binary zero condition. An R-C carrier oscillator generates a carrier signal which is sequentially modulated by the selected one of the plurality of code signals to produce a coded carrier signal. The coded carrier signal is fed to a transistorized current source for direct injection into the pickup coils and amplifier of the cab signal receiver. A four-pole double-throw center-off switch is arranged to establish a low simulated current level which is below the sensitivity range of the amplifier so that the display aspects of the cab signal equipment on board the locomotive remain unlit and are arranged to establish a high simulated current level which is above the sensitivity range of the amplifier so that the display aspects of the cab signal equipment on board the locomotive are sequentially lit. A power clear circuit is activated when operating power is applied to the test set through the four-pole double-throw switch to condition or initialize the state of the circuitry. As the clock pulses step up/down binary counter upwardly, the code selector changes the code rate of the code oscillator so that the coded carrier signal represents increased speed commands. When the highest coded carrier signal is reached, the up/down binary counter is at its maximum count which actuates an up count detector for toggling a flip-flop which causes the counter to count downwardly upon reception of next clock pulse. Thus, the code selector causes the code oscillator and, in turn, the coded carrier signal to go through the same sequence of speed commands but in a downward direction. Now the up/down binary counter has returned to its zero binary condition and generates a carry-out pulse which toggles an end of cycle detector flip-flop for shutting off the code oscillator which results in an uncoded carrier signal. The operating power to the test set is removed when the four-pole double-throw switch returns to its center-off position.

BRIEF DESCRIPTION OF THE DRAWINGS

The above objects and other attendant features and advantages of the present invention will become more readily apparent from the following detailed description when considered and reviewed in conjunction with the accompanying drawings, in which:

FIGS. 1A and 1B, when arranged in side-by-side relationship, illustrate in schematic form a circuit arrangement of the apparatus embodying the subject invention which provides an automatic departure test for cab signal equipment.

DETAILED DESCRIPTION OF THE INVENTION

Figure 1B:
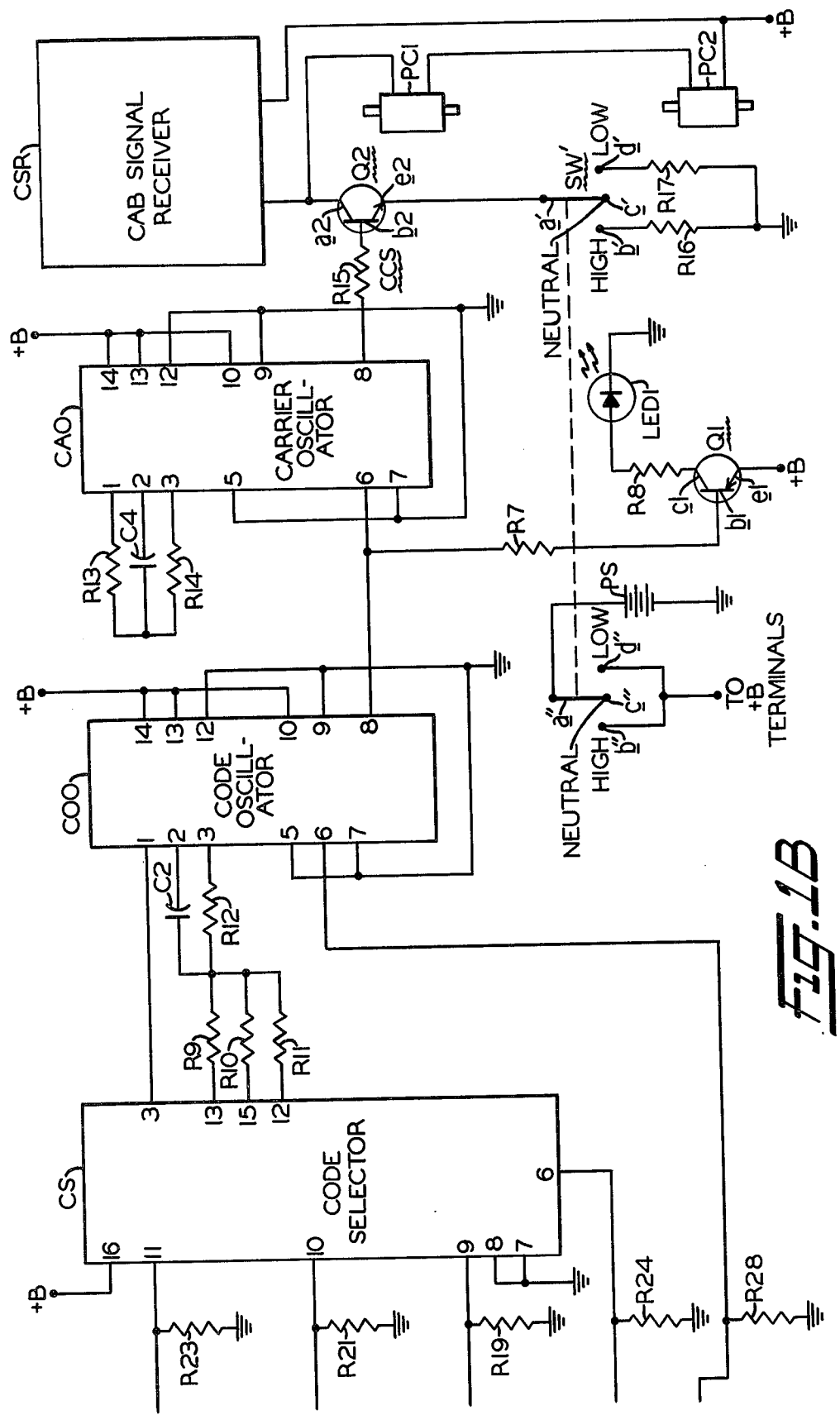

Referring now to the drawings, and in particular to FIGS. 1A and 1B, there is shown an electronic test set for testing the condition of the pick-up coils and the sensitivity of the receiver of cab signal equipment. It will be appreciated that FIG. 1A shows the left section and FIG. 1B shows the right section of the automatic cab signal test set.

In viewing FIG. 1A, it will be seen that a mode selector MS is conditioned by a single-pole double-throw switch SW having a movable contact a and a pair of stationary contacts b and c. The single-pole double-throw switch SW includes a Hold position when movable contact a engages stationary b and includes an Auto (automatic) position when movable contact a engages the stationary contact c. As shown, the stationary contact b is connected to a positive voltage terminal +B of a suitable power supply (not shown) via a voltage dividing network including resistors R1 and R2 while the stationary contact c is connected to the positive voltage terminal +B via a voltage divider including resistors R3 and R4. It will be seen that either voltage divider is energized by the movable contact a which is connected to a reference point or ground. The mode selector MS includes a pair of cross-coupled solid-state two-input "OR" gate G1 and G2 with inverted inputs. Each of the "OR" gates is activated when either or both inputs are at a low condition. It will be seen that the one input I1 of gate G1 is connected to the junction point formed between voltage dividing resistors R1 and R2 while the other input I1' is connected to the output O2 of gate G2. The one input I2 of gate G2 is connected to the junction point formed between voltage dividing resistors R3 and R4 while the other input I2' is connected to the output O1 of gate G1. The output O1 of gate G1 is also connected to the MR terminal 6 of a clock oscillator (CO) which may take the form of an integrated circuit programmable timer, such as, a low power complementary MOS type MC14541B, manufactured and sold by Motorola, Inc. When activated, the frequency of oscillation of the clock pulses developed on the output terminal 8 is determined by the RC time constant of resistor R5 and capacitor C1. In practice, the frequency of oscillation is selected to be 0.2 Hz or one cycle every five (5) seconds. As shown, one end of timing resistor R5 is connected to the $C_{tc}$ terminal 2. The other ends of resistor R5 and capacitor C1 are connected to one end of resistor R6 which has its other end connected to the $R_S$ terminal 3 of the clock oscillator CO. The AUTO RESET, $V_{SS}$ Q/Q select terminals 5, 7, and 9, respectively, are connected in common and, in turn, are connected to a point of reference or ground. The MODE, "A", "B", and $V_{DD}$ terminals, respectively, are connected in common and, in turn, are connected to the positive supply terminal +B.

As shown, the output terminal 8 of clock oscillator CO is connected to the clock terminal 15 BCD up/down counter BC, such as, a Motorola MOS MC14510B. The binary counter BC can be cleared or set to a zero count by applying a high level or binary "1" on the Reset terminal 9 as will be described hereinafter. The P4, P3, P2, P1 and carry-in terminals 3, 13, 12, 4, and 5 are commonly connected to ground while the $V_{DD}$ terminal 16 is connected to the positive supply terminal +B. As shown, the carry out terminal 7 is connected to the input of an inverting amplifier A1 which has its output connected to the Preset Enable terminal 1 of the up/down counter BC and to the clear terminal of a Reset flip-flop RFF which will be described in greater detail hereinafter. It will be noted that the Q1, Q2, Q3, and Q4 terminals 6, 11, 14, and 2 of the up/down binary counter BC are connected to the respective A1, A2, A3, and A4 terminals 10, 7, 2, and 15 of an up count detector UCD which may take the form of a four-bit magnitude comparator, such as, a Motorola MOS MC14585. In practice, the up count detector UCD is used to compare the four-bit binary number which is received from the up/down binary counter BC with a preprogrammed four-bit binary number. The detector UCD is factory set in accordance with the particular needs of the cab signal equipment of any given customer. In the present instance, the detector is programmed for a three aspect display or three speed command type of cab signal equipment. Thus, the B1 and B2 terminals 11 and 9 are connected to a high level, namely, the positive voltage terminal +B while the B3 and B4 terminals 1 and 14 are connected to a low level, namely, the ground point, so that the binary significance is 1100 which is equal to a decimal 3. As shown, the $V_{SS}$ terminal 8 is connected to ground while the terminals 16, 5, 6, and 4 are commonly connected to the positive supply terminal +B. Thus, when the binary code on terminals 10, 7, 2, and 15 equals the preprogrammed binary code on terminals 11, 9, 1, and 14, an output is developed on the terminal 5 of the up count detector UCD.

It will be seen that the output terminal 3 of the up count detector UCD is connected to the clock terminal 3 of a flip-flop FF which may be a dual type D flip-flop, such as, an MOS MC14013B mode and sold by Motorola, Inc. The Set terminal 6 is directly connected to ground while the Data terminal 5 is connected to the positive supply terminal +B. As shown, the Q terminal 2 of the flip-flop FF is connected to the up/down terminal 10 of the binary counter BC so that the direction of the count by counter BC is controlled by the flip-flop FF. In practice, when the output terminal 2 of flip-flop FF is a high or logical "1", the up/down binary counter BC will count up, and conversely when the output terminal 2 of flip-flop FF is a low or logical "0", the up/down binary counter BC will count down.

Referring now to FIG. 1B, there is shown the circuit means for producing a selected one of a plurality of coded carrier signals which are representative of a series of desired speed commands. As shown, a code oscillating or generating circuit COO may take the form of an integrated circuit programmable timer, such as, a low power complementary MOS MC14541B, manufactured and sold by Motorola, Inc. The code oscillator COO will oscillate a frequency at a frequency or coded rate determined by the R-C time constant of a selected one of a plurality of external resistance-capacitance networks which will be described presently. That is, the frequency of oscillation is a function of the resistive value of the $R_{tc}$ terminal 1 and the capacitive value on the $C_{tc}$ terminal 2 of the code oscillator COO. As will be described hereinafter, a fixed resistor is connected to the $R_S$ terminal 3 of the coded oscillator COO. The AUTO RESET, $V_{SS}$, Q/Q select and "A" terminals 5, 7, 9, and 12, respectively, are commonly connected to the positive supply terminal +B. The various code signals are developed on the output terminal 8, and are used to drive an amplifying transistor Q1. The PNP transistor Q1 includes a base electrode b1, a collector electrode c1, and an emitter electrode e1. As shown, the base electrode b1 is connected to output terminal 8 of code oscillator COO via resistor R7 while the emitter electrode is directly connected to the positive supply terminal +B. The collector electrode c1 is connected to the anode of a light emitting diode LED 1 via a current limiting resistor R8 while the cathode of diode LED 1 is connected to ground. In practice, the light emitting diode LED 1 may be visually observed by the operator or maintainer so that he may ascertain whether the test set is properly functioning. During the testing of the cab signal equipment the light emitting diode will flash in accordance with the give code rate of the oscillator COO.

As mentioned above, the frequency of the code oscillator is determined by the value of the resistance which is connected to terminal 1 and by the value of the capacitance which is connected to the terminal 2. In the present instance, the code oscillator is arranged to produce three (3) different code rates or frequencies which represent three (3) individual speed commands for testing the subject cab signal equipment. However, it will be understood that a greater or lesser number of code rates may be generated by the oscillator COO depending upon the specific needs of the particular cab signal equipment. As shown, the $R_{tc}$ terminal 1 of the code oscillator COO is connected to a common out/in terminal 3 of a code selector CS which may take the form of a digitally controlled analog switch, such as, a Motorola MOS MC14051. The analog code selector CS includes at least three switch in/out terminals 14, 15, and 12 and includes three control terminals 9, 10, and 11. It will be observed that the switch terminals 14, 15, and 12 are connected to a respective one of a plurality of timing resistors R9, R10, and R11. In practice, the resistive value of the timing resistors vary in decending order with the resistor R9 having the highest resistance. As shown, the remote ends of the timing resistors R9, R10, and R11 are connected in common and, in turn, are connected to one end of timing capacitor C2 and to one end of the fixed resistor R12. The other end of capacitor C2 is connected to the $C_{tc}$ terminal 2 of the code oscillator COO while the other end of resistor R12 is connected to the $R_S$ terminal 3 of the code oscillator COO. Thus, it will be seen that the frequency of oscillation of the code oscillator COO is determined by the R-C time constants of the resistive and capacitive values of R9-C2, R10-C2, and R11-C2 which produce code rates 75 cpm, 120 cpm, and 180 cpm, respectively. As will be described hereinafter, the code selector CS is controlled by the binary input signals that are applied to terminals 9, 10, and 11 which selectively cause one of the resistors R9, R10, or R11 to be connected from the switch terminal 3 of the code selector to the timing terminal 1 of the code oscillator COO. As shown, the $V_{EE}$ terminal 7 and the $V_{EE}$ terminal 8 of the code selector CS are commonly connected to ground while the $V_{DD}$ terminal 16 is connected to the positive supply terminal +B.

The carrier signals are also produced by an integrated circuit programmable timer CAO such as a Motorola MOS MC14541. As shown, the code signals from output terminal 8 of the code oscillator COO are fed to MR terminal 6 of the carrier oscillator CAO. The AUTO RESET terminal 5, $V_{SS}$ terminal 7, Q/Q select terminal and "A" terminal 12 of the carrier oscillator CAO are commonly connected to ground while the Mode terminal 10, "B" terminal 13 and $V_{DD}$ terminal 14 are commonly connected to the positive supply terminal +B. It will be appreciated that the frequency of oscillation of the carrier oscillator CAO is determined by the R-C time constant of resistor R13 and capacitor C3. As shown, the $R_{tc}$ terminal 1 of carrier oscillator CAO is connected to one end of timing resistor R13 while the $C_{tc}$ terminal 2 is connected to one end of timing capacitor C4. The other ends of resistor R13 and capacitor C4 are connected to one end of resistor R14 which has the other end connected to $R_S$ terminal 3 of the carrier oscillator CAO. Thus, the carrier oscillator CAO is switched ON and OFF by the code signals on terminal 6 so that coded carrier signals are produced on "Q" terminal 8.

It will be seen that the modulated or coded carrier appearing on terminal 8 are applied to the input of a constant current source CCS. The constant current source CCS includes an NPN amplifying transistor Q2 having a base electrode b2, a collector electrode c2, and an emitter electrode e2. As shown, the base electrode b2 is connected by resistor R15 to the output terminal 8 of the carrier oscillator CAO. The emitter electrode e2 is connected to a movable contact a' of a four-pole, double-throw, momentary-on toggle switch SW'. The switch SW' includes a first set of three stationary contact points b', c', and d', a second set of three stationary contacts b", c", and d". The contact points b' and b" may be labeled HIGH while the contact points d' and d" may be labeled LOW. The HIGH contact point b' is connected to ground via resistor R16 while the LOW contact point d' is connected to ground via resistor R17. As shown, the contact points b" and d" are commonly connected to furnish the +B voltage to the test set circuitry. The contact point c' and c" may be labeled NEUTRAL since neither is not connected to any circuit element. In practice, the movable contacts a' and a" will be biased to return to its NEUTRAL position when a maintainer is not holding the switch SW' in either the HIGH or LOW position. As shown, the collector electrode c2 which exhibits a very high impedance is directly connected to the upper end of a first pickup coil PC1 and to one lead of the cab signal receiver CSR. The lower end of a second pickup coil PC2 and the other lead of the cab signal receiver CSP are connected to the positive voltage terminal +B. It will be appreciated that the pickup coils PC1 and PC2 are connected in series additive relation so that the directly injected coded cab signals will be maximized at the input amplifier of the cab signal receiver.

As mentioned above, the code selector CS is conditioned by the binary state of the up/down binary counter BC. As shown, the output terminal 6 of the up/down binary counter BC is connected to input terminal 9 of the code selector via resistor R18. The terminal 9 of code selector CS is connected by resistor R19 to ground. The output terminal 11 of the up/down binary counter BC is connected to the input terminal 10 of the code selector CS via resistor R20 while the terminal 10 of the code selector CS is connected to ground via resistor R21. The output terminal 14 of the up/down binary counter BC is connected to the input terminal 11 of the code selector CS via resistor R22 while the terminal 11 of the code selector CS is connected to ground via resistor R23. It will be seen that the Inhibit terminal 6 of the code selector CS is connected to ground via resistor R24 and to the output of an integrated circuit inverting amplifier A2 via resistor R25. The input to the inverting amplifier A2 is connected to the junction point formed between a series connected resistor R26 and capacitor C5. The upper end of resistor R26 is connected to the positive supply terminal +B while the lower plate of capacitor C5 is connected to ground. The inverting amplifier A2, the resistor R26, and capacitor C5 are termed a power-up clear circuit which initializes the states of the various circuits and insures that the up/down binary counter BC is initially in a binary zero state. As shown, the output of the inverting amplifier A2 is connected to the Reset terminal 9 of the up/down binary counter BC as well as to the Reset terminal 10 of the flip-flop circuits RFF. It will be noted that the Data terminal 9 of the flip-fop circuit RFF is connected to the positive supply terminal +B while the Set terminal 8 is connected to ground. The Q terminal 13 of the flip-flop circuit RFF is connected to the Master Reset terminal 6 of the code oscillator CO via resistor R27 while the Master Reset terminal 6 is connected to ground via resistor R28.

Now in describing the operation, it will be assumed that the cab signal test set is intact, that the circuitry is functioning properly, and that the maintainer desires to perform the daily departure prior to releasing the train into revenue service. In order to initiate with a testing procedure, the zero velocity apparatus must indicate that the train is at a stop and the brakes are applied. With the brakes applied, the brake line pressure results in the closure of an electrical contact which causes a positive operating voltage to be applied to the +B terminals. The application of the positive voltage +B results in the initial condition of the various circuit. That is, when power is applied to the system, the inverting amplifier A2 of the power-up clear circuit will go high. Now when the capacitor C5 charges to approximately seventy percent of the supply voltage, the inverting amplifier A2 will switch to a low level. The momentary pulse generated by the inverting amplifier results in the following initial conditions. First, the up/down binary counter BC is reset to a binary zero state. The output 2 of the flip-flop FF is preset to a logical "1" which establishes the direction of count of the up/down counter BC. Thus, the logical "1" is fed from terminal 2 of the flip-flop FF to the terminal 10 of the up/down counter BC to insure that the counter BC will initially count upwardly. The output terminal 13 of flip-flop RFF is preset to a logical "1". Further, let us assume the switch SW is in the illustrated position in FIG. 1, namely, movable contact a is in engagement with fixed contact c so that the mode selector MS is the Auto position. Under this condition, the output of the gate G1 is low so that the clock oscillator is free to oscillate at 0.2 Hz. Further, let us assume that the operator or maintainer is holding the switch SW' in its LOW position wherein movable contacts a' and a" are engaged with fixed contacts d' and d". Further, let us assume that the sensitivity of the amplifier of the cab signal equipment is set and adapted to operate between 0.45 to 0.55 amperes of rail current so that test set is arranged at the factory to simulate a rail current of 0.4 amperes in the LOW position and to simulate a rail current of 0.6 amperes in the LOW position and to simulate a rail current of 0.6 amperes in the HIGH position. In the LOW position, the aspect display in the cab of the locomotive should not respond to the simulated 0.4 ampere rail current; however, the light emitting diode LED on test set 1 will flash at the code rate of the oscillator COO which will indicate that the test set is properly functioning.

Now when the first clock pulse appears of output terminal 8 of clock oscillator CO, it is fed to terminal 15 of the up/down counter BC which changes from a 000 state to a 001 state. The 001 condition on terminals 6, 11, and 14 of up/down binary counter BC is applied to terminals C, B, and A, respectively, of the code selector CS. This causes the code selector CS to switch to a condition in which the resistor R9 is connected to terminal 1 of the code oscillator. Thus, the code oscillator COO oscillates at a frequency which is equal to 75 cpm. Thus, a 75 cpm signal is developed on the output terminal 8. Thus, the light emitting diode LED 1 will flash at a 75 cpm code rate. The code signals are also fed to the terminal 5 of the carrier oscillator CAO so that the 100 hertz carrier signals are turned on and off at a rate of 75 cpm. As mentioned above, the low speed cab signal aspect on board the locomotive will not become illuminated because the coded level of the carrier signal is equivalent to approximately 0.4 amperes of rail current. Now when the next clock pulse is produced by the clock oscillator CO, the up/down binary counter advances to the next high count which in this case will cause an 010 state on terminals 6, 11, and 14. The 010 state of terminals C, B, and A of the code selector CS results in the connection of resistor R10 to the $R_{tc}$ terminal 1 of code oscillator COO. Thus a 120 cpm code signal will be developed on output terminal 8 so that the light emitting diode LED 1 will flash at a rate of 120 times per minute. The 120 cpm code signals are also fed to the carrier oscillator via input terminal 6 so that coded carrier signals are developed on output terminal 8. However, the amplified signals applied to the pickup coils in the cab signal receiver will have a value of approximately 0.4 amperes of rail current. Again this amount of current is less than that which is equal to 0.45 amperes of rail current so that the medium speed display aspect on board the locomotive will not be illuminated.

Now when a third clock pulse is generated by the clock oscillator CO, the up/down binary counter BC will produce a binary state of 110 on terminals 6, 11, and 14, respectively. This binary state on input terminals C, B, and A causes the code selector to interconnect resistor R11 to the $R_{tc}$ terminal 1 of the code oscillator COO. Thus, the frequency of the code signals will become 180 cpm. Thus, the light emitting diode will flash at a rate of 180 times per minute. Again, the carrier signal is modulated but at a 180 cpm rate. The amplified signals from transistor Q2 are fed to the pickup coils and amplifier of the cab signal receiver CSR. However, since the amplitude of the amplified carrier signal is only representative of approximately 0.4 amperes of rail current, the high speed display aspect will not become illuminated.

It will be seen that the 1100 binary number appearing on terminals 6, 11, 14, and 2 of the up/down binary counter B corresponds to the 1100 binary number which is preprogrammed on terminals 11, 9, and 14 of up counter detector UCD. Thus, when the binary number of input terminals 10, 7, 2, and 15 of the detector UCD matches the preprogrammed binary number on terminals 11, 9, 1, and 14 a signal pulse is developed on terminal 3 which in turn is applied to the terminal 3 of flip-flop FF. This causes the flip-flop FF to change state so that output terminal 2 goes from a high to a low level. The low is applied to terminal 10 of the up/down binary counter BC which conditions the counter to count downwardly when the next clock pulse is applied to its input terminal 15.

Thus, the next clock pulse causes the counter BC to count downwardly so that terminals 6, 11, and 14 change from a binary number 110 to a binary number 010. Accordingly, the code selector CS interconnects resistor R10 to the $R_{tc}$ terminal 1 so that the code oscillator COO reverts to a 120 cpm. However, the amplified coded carrier signal applied to the cab signal receiver at a simulated 0.4 amperes of rail current remains so that the medium speed aspect display is not illuminated, but the maintainer may ascertain the operation of the test set by observing the flashing of the light emitting diode LED 1. Now when the next clock pulse is generated by the clock oscillator CO, the up/down binary counter BC again shifts downwardly and produces a binary 100 on terminals 6, 11, and 14, respectively. This causes the code selector CS to interconnect the resistor R19 to the $R_{tc}$ terminal 1 of the code oscillator COO. Thus, the code oscillator COO reverts to a 75 cpm code rate. Thus, the carrier signal is modulated at a 75 cpm code rate, but the amplified coded carrier signal applied to the cab signal receiver CSR is below the simulated 0.45 ampere level so that the low speed aspect display aspect remains unlighted. Again, the maintainer may ascertain the operation by observing the flashing of the light emitting diode LED 1. Now when the next clock pulse is produced by the clock oscillator CO, the up/down binary counter BC will go to a zero state wherein the terminals 6, 11, and 14 will assume a low or binary "0" condition. Thus, the code selector CS disconnects all of the resistors R9, R10, and R11, from terminal 1, and thus the code oscillator COO becomes quiescent. Accordingly, the light emitting diode LED 1 ceases to flash and stays illuminated due to the steady energization of transistor Q2. Further, an uncoded Q2 carrier signal is applied to the amplifying transistor Q2 and in turn to pickup coils PC1 and PC2 and the amplifier of the cab signal receiver CSR. Further, when the counter goes to a zero state a carry-out pulse is developed on terminal 7 which is used to hold counter BC at zero state and is also used to toggle the end of cycle detector flip-flop RFF. Thus, the output terminal 13 of flip-flop RFF will change from a low to a high which will turn off the code oscillator COO. Now when the maintainer releases the switch SW the movable contact a" goes to its center-off position and the power supply voltage is removed from terminals +B.

It is now desirable to cycle the test set through the high mode of operation in order to verify the integrity of the pickup coil and the sensitivity of the amplifier of the cab signal receiver. As mentioned above, the switch SW' controls the application of operation power to the positive supply terminals +B. When the switch SW' is in either the HIGH or LOW positions b" or d", a +15 volts is applied to the positive supply terminals +B from the d.c. supply voltages PS, and when the switch SW' is in the center-off position c", no power is supplied to the circuitry of the test set. Now when the maintainer flips the switch SW to the HIGH position, the movable contact b" is engaged by movable contact a" to supply +15 volts to all of the positive supply terminals +B. Thus, the inverting amplifier A2 of the power clear circuit produces a high signal. Now when the capacitor C5 charges to approximately seventy percent of the +15 volt supply potential PS, the output of the inverting amplifier A2 will go to a low condition. The momentary output pulse of the inverting amplifier A2 will again initially condition the various circuits to begin the sequential testing of the cab signal equipment at the high 0.6 amperes of simulated rail current. The momentary pulse resets flip-flop RFF so that the output terminal goes low to permit the code ocillator to go into oscillation as will be described presently. The output pulse of amplifier A2 momentarily inhibits the code selector CS and resets the flip-flop FF so that the output terminal 2 goes to a high signal level. The high signal is conveyed to terminal 10 of the up/down binary counter BC which insures that the counter will count in an upward direction. With the switch SW in the AUTO position, the low on the output of gate G1 will start the clock oscillator CO. As previously mentioned, the clock oscillator CO will advance the binary state of the binary counter BC every 5 seconds until the maximum binary number, namely, 110, has been reached, and then the up count detector UCD will toggle the direction detector flip-flop FF for changing the direction of the up/down binary counter BC so that it will count in a downward direction. Thus, the counter BC will count down from the 110 state to a binary zero, namely, a 000 state. The binary counter BC will produce a carry-out signal when the binary zero state to toggle the end of cycle detector flip-flop RFF. The end of cycle detector flip-flop RFF causes the code oscillator COO to produce a low output which results in the steady energization of the light emitting diode LED 1 until the operator or maintainer releases the toggle switch SW'. The release of the switch SW' from the HIGH position causes the movable contacts a' and d' to move to their NEUTRAL position which removes the operating voltage from the positive supply terminals +B and deenergizes the test set.

Let us now return to the point where the clock oscillator CO produces its first clock pulse to advance the up/down binary counter BC from its binary zero to its binary "1" state, and let us observe the operation with the switch SW' in its HIGH position. Thus, a binary 100 again appears on terminals 6, 11, and 14 which causes the code selector CS to interconnect the resistor R9 to terminal 1 of the code oscillator COO. Accordingly, the code oscillator CO produces a code rate of 75 cpm. Once again, the transistor drive Q1 causes the light emitting diode to flash at a rate of 75 cpm. The 75 cpm code rate also modulates the carrier frequency signal of the carrier oscillator CAO. The coded carrier signal is applied to the amplifying transistor Q1. It will be appreciated that the value of the resistor R17 has been selected to cause the amplifying transistor Q1 to produce a simulated current signal which is equal to approximately 0.6 of rail current. Thus, the amplified coded carrier signal injected into the pickup coils PC1 and PC2 and the amplifier of the cab signal receiver CSR is now in excess of the upper 0.55 ampere level so that the decoding unit of the cab signal equipment will illuminate the low speed display aspect. The illumination of the display aspect verifies the integrity of the pickup coils and also substantiates the fact that the sensitivity of the amplifier of the cab signal receiver lies between the range of 0.4 to 0.6 amperes of rail current for the 75 cpm code rate. After 5 seconds have elapsed, the clock oscillator CO will clock the counter B to a 010 binary state. Thus, the code selector CS interconnects the resistor R10 to terminal 1 of the code oscillator COO which will now oscillate at a frequency equal to a 120 cpm code rate. The light emitting diode LED 1 will flash at a 120 cpm code rate, and the carrier signal will be modulated by the 120 cpm code. The coded carrier signal is directly injected into the pickup coils and receiver amplifier by transistor Q2, and if the amplified simulated signal is at 0.6 amperes of rail current, the medium speed display aspect will be illuminated which signifies that the cab signal equipment is properly functioning. Again after a 5 second period has elapsed, the clock oscillator CO will step the counter BC to a binary 110 state. This causes the code selector CS to switch in resistor R11 to terminal 1 of the code oscillator COO. Now the code oscillator COO will generate a 180 cpm code rate for flashing light emitting diode LED 1 and for modulating the carrier signal of oscillator CAO. If the amplified coded carrier signal is at a simulated level of 0.6 amperes of rail current, the high speed display will be illuminated to signify the the integrity of the pickup coils and the proper operation of the amplifier of the receiver.

At this time the binary code on terminals 6, 11, 14, and 2 of the up/down binary counter BC and on terminals 10, 7, 2, and 15 of up counter detector UCD matches the binary code on terminals 11, 9, 1, and 4 so that a clock pulse appears on output terminal 3. The clock pulse causes the output terminal 2 of flip-flop FF to toggle to a low state which, in turn, causes the up/down counter BC to count down on the next clock pulse received from the clock oscillator CO. Thus, the succeeding clock pulses will cause the count BC to sequentially step downwardly from binary state 110 to 010 to 100 and finally to the zero state 000. At the zero state, the counter BC will generate a carry-out pulse which toggles the end of cycle detector flip-flop RFF to shift the output to a high condition. Thus, the code oscillator COO will be turned off which will cause the transistor Q1 to continually conduct so that diode LED 1 is constantly illuminated to signify end-of-test. Now when the maintainer releases the switch SW', the movable contacts a' and a" will return to their NEUTRAL contacts c' and c" which causes the deenergization of the test set by removing the operating potential from terminals +B.

It will be appreciated that the HOLD position of the switch SW is employed in stopping the testing operation. That is, when the switch SW is thrown to the HOLD position, the output of the gate G1 will go high which will inhibit the production of the 5 second clock pulses. In order to resume the testing sequence, it is simply necessary to return the switch SW to the AUTO position wherein the output of gate G1 will provide a low to the terminal 6 of the clock oscillator CO so that the oscillation will reoccur and clock pulses will be generated on output terminal 8.

It will be understood that the various changes and modifications may be made by those skilled in the art without departing from the spirit and scope of the subject invention. Accordingly, it will be appreciated that certain variations, alterations, ramifications, and equivalents will be apparent to persons skilled in the art, and therefore, it is understood that the present invention should not be limited to the exact embodiment shown and described herein but should be accorded the full scope and protection of the appended claims.

Having now described the invention what I claim as new and desire to secure by Letters Patent, is:

1. A cab signal test set for automatically testing the integrity of pickup coils and for checking the sensitivity of an amplifier of a cab signal receiver of cab signal equipment comprising, a mode selector means electrically connected to a clock means for starting a timing rate, said clock means electrically connected to a counting means for initiating a counting operation in accordance with the timing rate, said counting means electrically connected to a code selecting means for causing a code action, said code selecting means connected to a code oscillating means, said code oscillating means connected to a carrier oscillating means, said carrier oscillating means producing a series of modulated carrier signals and directly injecting in a sequential order a selected one of the series of modulated carrier signals into the pickup coils and receiver to simulate legitimate cab signal speed commands for verifying the functionality of the cag signal equipment.

2. The cab signal test set as defined in claim 1, wherein said mode selector means includes a pair of cross coupled gates and a switching means having a first position which causes said cross coupled gates to produce a low output to stop said counting means and having a second position which causes said cross coupled gates to produce a high output to start said counting means.

3. The cab signal test set as defined in claim 1, wherein said clock means is an integrated circuit oscillator having a frequency which is determined by an R-C network.

4. The cab signal test set as defined in claim 1, wherein said counting means includes an integrated circuit up/down binary counter.

5. The cab signal test set as defined in claim 1, wherein said code selecting means is a multiple channel digitally controlled multiplexer.

6. The cab signal test set as defined in claim 1, wherein said code oscillating means is an integrated circuit oscillator for producing a code rate which is controlled by varying the time constant of an R-C network.

7. The cab signal test set as defined in claim 1, wherein said carrier oscillating means is an integrated circuit oscillator having its carrier signal modulated by the code rate of said code oscillating means.

8. The cab signal test set as defined in claim 1, wherein a power-up clear circuit resets said counting means to a zero state when power is initially applied to the cab signal test set.

9. The cab signal test set as defined in claim 8, wherein said power-up clear circuit resets a first flip-flop circuit which initially conditions said counting means to count in an upward direction.

10. The cab signal test set as defined in claim 9, wherein said first flip-flop circuit causes said counting means to begin counting in a downward direction when said counting means reaches its maximum count.

11. The cab signal test set as defined in claim 10, wherein said counting means causes an inverter to toggle a second flip-flop which inhibits said code selecting means thereby signifying a completion of a test cycle.

12. The cab signal test set as defined in claim 1, wherein an amplifier is electrically connected to said code oscillating means for causing an indicator light to flash in accordance with the code rate of said code oscillating means.

13. The cab signal test set as defined in claim 8, wherein said power-up clear circuit includes an inverter and a timing network electrically connected to its input for switching the state of said inverter.

* * * * *

UNITED STATES PATENT AND TRADEMARK OFFICE
CERTIFICATE OF CORRECTION

PATENT NO. : 4,437,056
DATED : March 13, 1984
INVENTOR(S) : Joseph J. Pierro, Jr.

It is certified that error appears in the above-identified patent and that said Letters Patent are hereby corrected as shown below:

Column 12, line 40, change "code", first occurrence, to --coding--

Signed and Sealed this

Fourth Day of September 1984

[SEAL]

Attest:

Attesting Officer

GERALD J. MOSSINGHOFF

Commissioner of Patents and Trademarks